United States Patent [19]

Konsevich

[11] Patent Number: 4,566,231
[45] Date of Patent: Jan. 28, 1986

[54] VIBRATION DAMPING STIFFENER

[75] Inventor: Francis X. Konsevich, Federal Way, Wash.

[73] Assignee: The Boeing Company, Seattle, Wash.

[21] Appl. No.: 536,555

[22] Filed: Sep. 27, 1983

[51] Int. Cl.[4] ............................................. E04B 1/98
[52] U.S. Cl. ...................................... 52/145; 52/167; 52/403; 52/727; 52/729; 181/208; 181/290
[58] Field of Search ................. 52/144, 403, 727, 728, 52/729, 145, 167, 806, 393, 807, 811; 181/207, 208, 213, 214, 222, 286, 288, 290, 292

[56] References Cited

U.S. PATENT DOCUMENTS

| | | | |
|---|---|---|---|
| 3,020,986 | 2/1962 | Kirk et al. | 52/806 |
| 3,078,969 | 2/1963 | Campbell et al. | 52/403 |
| 3,078,971 | 2/1963 | Wallenstein, Jr. | 52/403 |
| 3,087,570 | 4/1963 | Watters et al. | 181/208 |
| 3,087,574 | 4/1963 | Watters | 181/208 |
| 3,088,561 | 5/1963 | Ruzicka | 52/727 |
| 3,499,255 | 3/1970 | Sweeney et al. | 52/403 X |
| 3,976,269 | 8/1976 | Gupta | 52/144 |
| 4,133,157 | 1/1979 | Bschorr et al. | 52/403 |
| 4,346,782 | 8/1982 | Böhm | 181/208 X |
| 4,416,349 | 11/1983 | Jacobs | 52/145 X |
| 4,425,980 | 1/1984 | Miles | 52/403 X |
| 4,516,658 | 5/1985 | Scarton et al. | 181/208 |

FOREIGN PATENT DOCUMENTS

| | | | |
|---|---|---|---|
| 6716001 | 5/1968 | Netherlands | 52/403 |
| 2088027 | 6/1982 | United Kingdom | 181/208 |

Primary Examiner—Donald G. Kelly
Assistant Examiner—Richard E. Chilcot, Jr.
Attorney, Agent, or Firm—Bruce A. Kaser; Delbert J. Barnard

[57] ABSTRACT

A vibration dampening stiffener beam (10, 10') is secured to a panel member, such as an electrical circuit board (12) that is supported at opposed ends. The beam (10, 10') extends across a mid portion of the board (12) whereat displacement of the board caused by vibration is at a maximum. The beam is an "I" beam or an inverted "T" beam. It has a mounting flange (22, 22') which is bonded or otherwise secured to the member (12) which it is to stiffen. An energy absorbing material (30) is placed on the sides of the web (24, 24') of the beam (10, 10"). This material (30) consists of thin metal constraining layers (32) bonded to each other and to the side surfaces of the web by means of a viscoelastic material (34).

16 Claims, 8 Drawing Figures

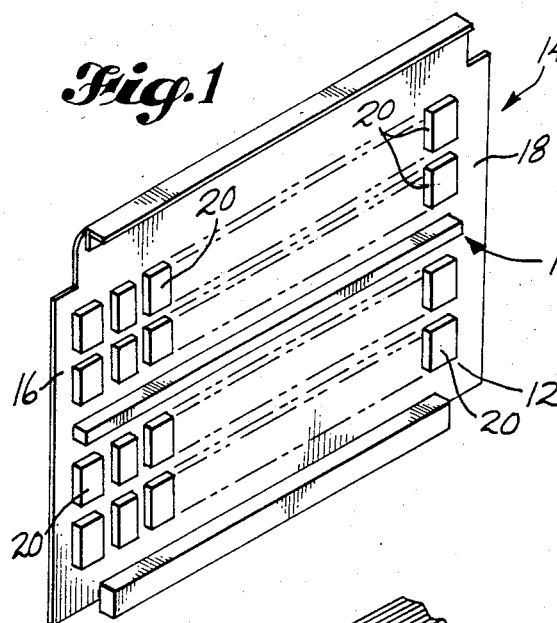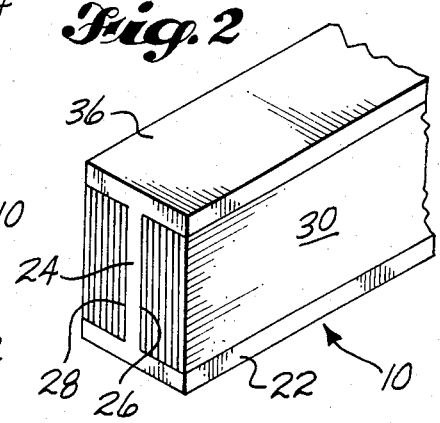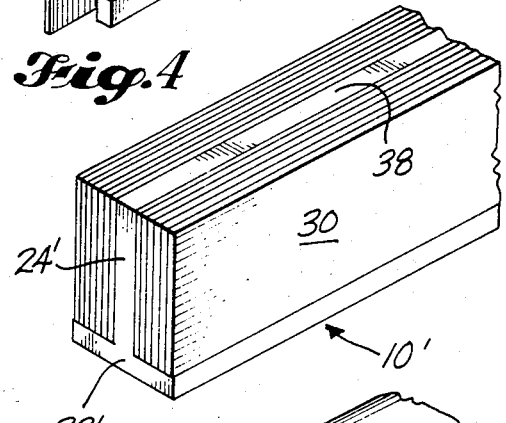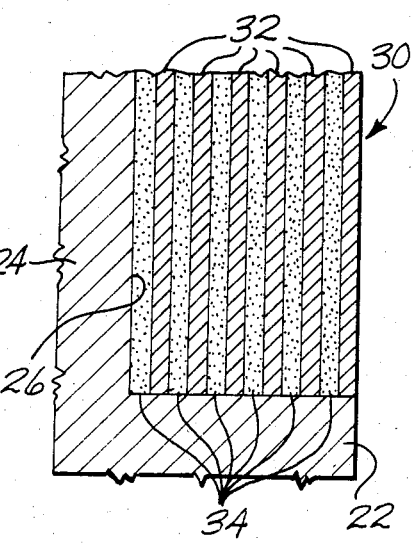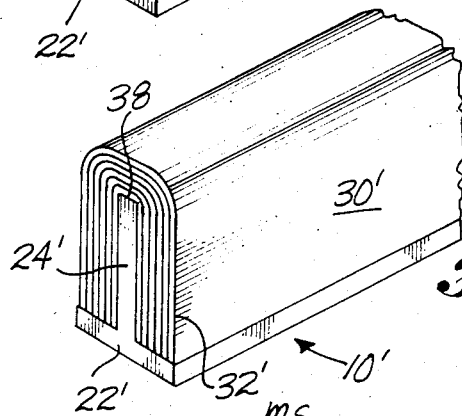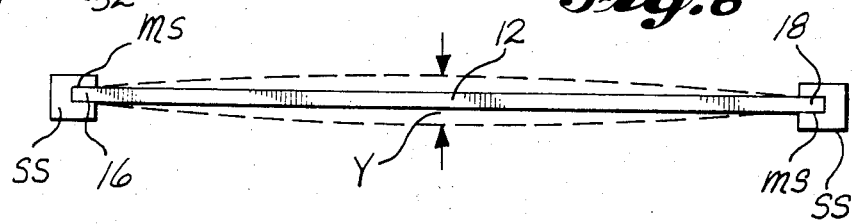

VIBRATION DAMPING STIFFENER

DESCRIPTION

1. Technical Field

This invention relates to vibration damping of structures. More particularly, it relates to the provision of a simple stiffening beam which is adapted to be attached to a structure such as an electrical circuit board assembly, or the like, for stiffening the structure, and to which a vibration absorbing material has been attached and arranged to absorb substantial energy as the beam is deflected.

2. Background Art

Panel structures which are edge supported experience a center area displacement of substantial magnitude in response to mechanical vibration. The type of movement experienced by the panel is commonly referred to as "oil canning" because it is like the motion experienced by the bottom of an oil can in response to thumb pressure being applied to and released from it for the purpose of pumping oil out from the can.

This type of vibration can cause considerable damage to components mounted on the panel member. For example, electrical wiring will fatigue, switches will open and close, electrical components will crack or break, and the panel itself will experience fatigue.

Problems caused by vibration exist in many environments and many solutions have been proposed for solving these problems. U.S. Pat. No. 4,133,157, granted Jan. 9, 1979, to Oskar Bschorr and Helmut Albrecht discloses dampening flexural vibrations induced into a structural plate member by positioning a beam alongside of and in contact with the structural plate member. The beam is mounted in such a way that a relative movement occurs between it and the structural plate member, in response to vibrations. The relative movement has a dampening effect. In addition, a viscous dampening material is positioned between the structural plate member and the dampening beam and functions to dampen vibration by absorbing frictional energy from the relative motion between the beam and the plate member.

A principal object of the present invention is to use a beam approach to dampening vibrations induced into a panel member, but in a way that is different from the beam use disclosed by U.S. Pat. No. 4,133,157.

Various other ways of dampening vibrations, involving the use of stiffening members and/or dampening materials, are proposed in the following U.S. Pat. No. 2,819,032, granted Jan. 7, 1958, to Arthur J. Detrie et al; U.S. Pat. No. 3,058,704, granted Oct. 16, 1962, to Milton A. Bergstedt; U.S. Pat. No. 3,083,259, granted Mar. 26, 1963, to Doyle C. Wells; U.S. Pat. No. 3,271,188, granted Sept. 6, 1966, to Walter Albert et al; U.S. Pat. No. 3,388,772, granted June 18, 1968, to Francis X. Marsh et al; U.S. Pat. No. 3,472,472, granted Oct. 14, 1969, to Lucio Maestrello; U.S. Pat. No. 3,976,269, granted Aug. 24, 1976, to Gautam Sen Gupta; U.S. Pat. No. 4,023,651, granted May 17, 1977, to Kenneth Healiss et al; U.S. Pat. No. 4,091,232, granted May 23, 1978, to Gerd Gerry Lenk et al; U.S. Pat. No. 4,120,382, granted Oct. 17, 1978, to Oskar Bschorr; U.S. Pat. No. 4,203,546, granted May 20, 1980, to Erwin Raquet et al and U.S. Pat. No. 4,278,726, granted July 14, 1981, to Andre Wieme.

A preferred form of energy absorbing material used in the practice of the present invention is disclosed in a brochure published by the 3M Company, entitled "New Techniques, Products And Applications In Constrained Layer Damping".

The above patents and the brochure should be carefully considered for the purpose of putting the present invention into proper perspective relative to the prior art.

DISCLOSURE OF THE INVENTION

In basic form, the stiffening beam of the present invention is adapted to be secured to a mid portion of a structural member, to span across the member and stiffen the member, to in this manner increase its frequency of vibration while at the same time decreasing displacement of vibration. The beam includes at least one side surface which extends generally perpendicular to the structural member. A damping material is secured to the side surface. The material functions to further dampen vibrations by absorbing energy as the beam is deflected.

In preferred form, the damping material comprises a plurality of layers of sheet material laminated to each other and to the side surface of the beam. The layers of sheet material are secured to each other and to the side surface of the beam by an adhesive material.

In accordance with an aspect of the invention, the adhesive material is a viscoelastic material.

In accordance with another aspect of the invention, the sheet material is a metallic foil material.

In preferred form, the stiffening beam includes a mounting flange portion which is secured along its length to the member, and a web portion connected to the flange portion which extends perpendicular to both the mounting flange and the member to which the mounting flange is secured. Damping material is secured to a least one side of the web, but in preferred form is secured to both sides of the web.

The stiffening beam may take many forms. For example, it may be an I-beam, or it may be an inverted T-beam. An advantage of the inverted T-beam is that it allows the layers of sheet material to be continuous from one side of the web to the other.

Other more detailed aspects of the invention are stated and described in the description of the best mode of the invention.

BRIEF DESCRIPTION OF THE DRAWINGS

Like reference numerals are used to designate like parts throughout the several views of the drawings, and:

FIG. 1 is a pictorial view of an electrical component board, showing a vibration damping stiffening beam secured to a mid portion of the board;

FIG. 2 is an enlarged scale pictorial view of an end portion of a first embodiment of the vibration damping stiffening beam, showing energy absorbing material attached to both sides of a web portion of the beam;

FIG. 3 is an enlarged scale, fragmentary, cross-sectional view taken through the beam of FIG. 2, showing web and flange portions of the beam and further showing the laminated nature of the energy absorbing material;

FIG. 4 is a view like FIG. 2, but of a second embodiment of the invention in which the beam is an inverted "T" beam;

FIG. 5 is a view like FIG. 4, but of a third embodiment in which the energy absorbing material is continuous from one side of the beam to the other;

FIG. 6 is an end view of a printed wiring assembly board, showing the board mounted in a manner in which opposite edge portions of the board are constrained, and showing the displacement of the board in response to vibration, in an exaggerated manner;

BEST MODE FOR CARRYING OUT THE INVENTION

Figure 7:
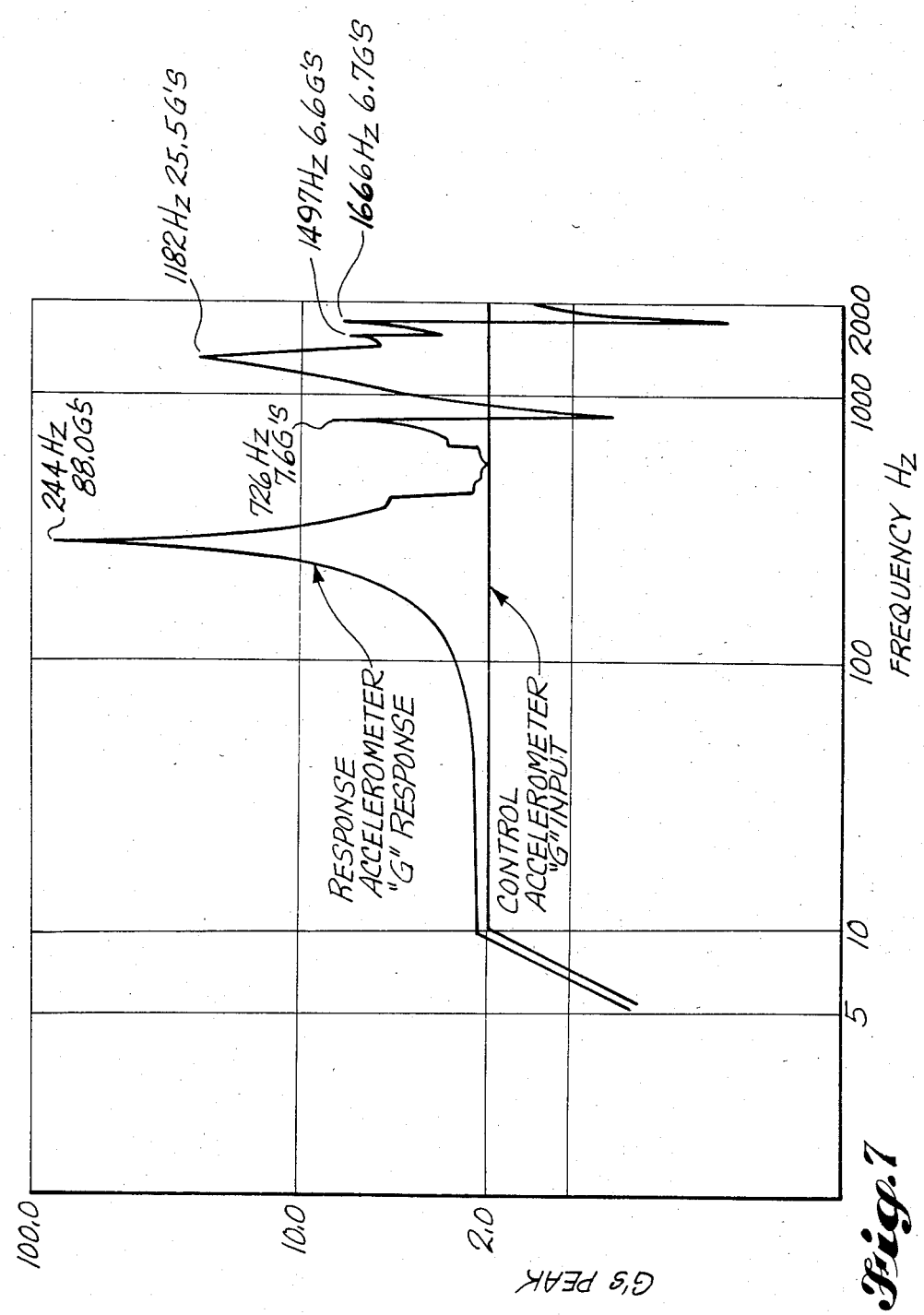
FIG. 7 is a graph of acceleration verses frequency, illustrating the dynamic vibrational response of a printed wiring assembly board which does not include a vibration damping stiffening beam.

Referring to FIG. 1, in accordance with the present invention a vibration dampening stiffening beam 10 is secured to a panel member, such as a printed wiring board portion 12 of a printed wiring assembly 14, for example, to span across a mid portion of the board 12, generally whereat displacement of the board in response to vibration forces is at a maximum. In a typical installation, the board 12 includes opposite end portions 16, 18 which are received in mounting slots MS (FIG. 6) of a suitable support structure SS. In this manner, the end portions 16, 18 are restrained and the board is free to bow back and forth in its span between the restrained ends 16, 18, as shown in FIG. 6.

In a typical installation, the board 12 will mount a plurality of electrical components, some of which are illustrated and designated 20.

The vibration dampening stiffening beam may take different forms. For example, in FIG. 2 it is shown in the form of an "I" beam 10. In FIGS. 4 and 5 it is shown in the form of an inverted "T" beam 10'. An essential feature of whatever type of beam that might be used is that it includes a broad mounting base. The beams 10, 10' include a mounting base in the form of a mounting flange 22, 22'. Beams 10, 10' also include a stiffening web 24, 24'. In addition to stiffening the beam 10, 10' in the direction that the board 12 wants to bow, the web 24, 24' provides opposite side surfaces 26, 28 to which an energy absorbing material 30 is attached.

The mounting flange portions 22, 22' of the beams 10, 10' may be secured to the board 12 by adhesive bonding, brazing, welding, mechanical fasteners, or a combination of any of these means of attachment.

In preferred form, the energy absorbing material 30 comprises a plurality of strips of a metallic foil 32 which are connected to each other and to the side surfaces 26, 28 of the web 24 by adhesive layers 34. The metal strips 32 preferably extend the full length of the stiffening beam 10, 10' and are of a depth substantially equaling the depth of the web 24. The arrangements shown by FIGS. 2 and 4 are alike except that the "I" beam 10 shown by FIG. 2 includes a second flange 36, whereas the inverted "T" beam 10' shown by FIG. 4 has a web edge 38 as its outer boundary in place of the second flange 36.

In the embodiment shown by FIG. 5, the metallic sheet members 32' are continuous from one side of the web 24' to the other. In some installations, it may be necessary to locate dampening material 30 on only one side of the web 24. In preferred form, the thin metal strips 32 are laminated to each other and to the side surfaces 26, 26' and 28, 28' by means of a viscoelastic adhesive material 34.

Good results were obtained when a soft aluminum foil sound dampening tape was used as the energy absorbing material 30. The material used is manufactured by the 3M Company, and sold as Scotch (trademark) Sound Dampening Tape No. Y434. This tape has an aluminum foil thickness of 7.5 mil. and comes coated with a viscoelastic adhesive. It need only be cut to size and then applied onto the web portions 24, 24' of the beams 10, 10'. The number of layers of the metallic sheet members 32, 32' must only be sufficient to achieve good dampening. In an example embodiment, involving an "I" beam 10, six layers of the thin metal tape strips 32 were applied to each side of the web 24. The "I" beam 10 that was used had a width of approximately 0.125 inches and a depth of approximately 0.3 inches. The six layers on each side of the beam provided good results.

When a member like a circuit board vibrates the vibration is amplified. The amount of vibration of a circuit board can be measured in terms of both displacement and acceleration. The vibration of the board can amplify a small "g" imput into a large "g" response and this can create substantial problems, in the form of structural damage to the electrical components carried by the board 12.

In an attempt to solve the vibration problem, the sound dampening tape No. Y434 was first applied in layers flat onto the board 12, but this use was not effective. The stiffening beam was then added and the sheet material was placed onto the side surfaces of the web of the beam. This orientation of the tape layers put the layers in shear, and proved to be a quite effective way of absorbing vibrational energy.

The combination of the stiffening beam and the energy absorbing material work very effectively to solve the amplification problems caused by vibration forces acting on the board 12. The beam 10 stiffened the board 12 and in doing this increased the frequency of vibrational response.

The amplification factor of a vibrating body is a function of frequency and displacement, but with a higher frequency of vibration, the amount of displacement is lower. In other words, low frequency vibration produces a larger displacement. High frequency vibration produces a lower displacement. The lower displacement acts to reduce damage and the absorbing material acts to reduce the amplification between the "g" input and the "g" response.

The relationship between "g" response, frequency and displacement of the board caused by vibration is shown by the following equation:

$$g = (f^2)(y)/9.8$$

where f = frequency
and y = displacement

Figure 8:
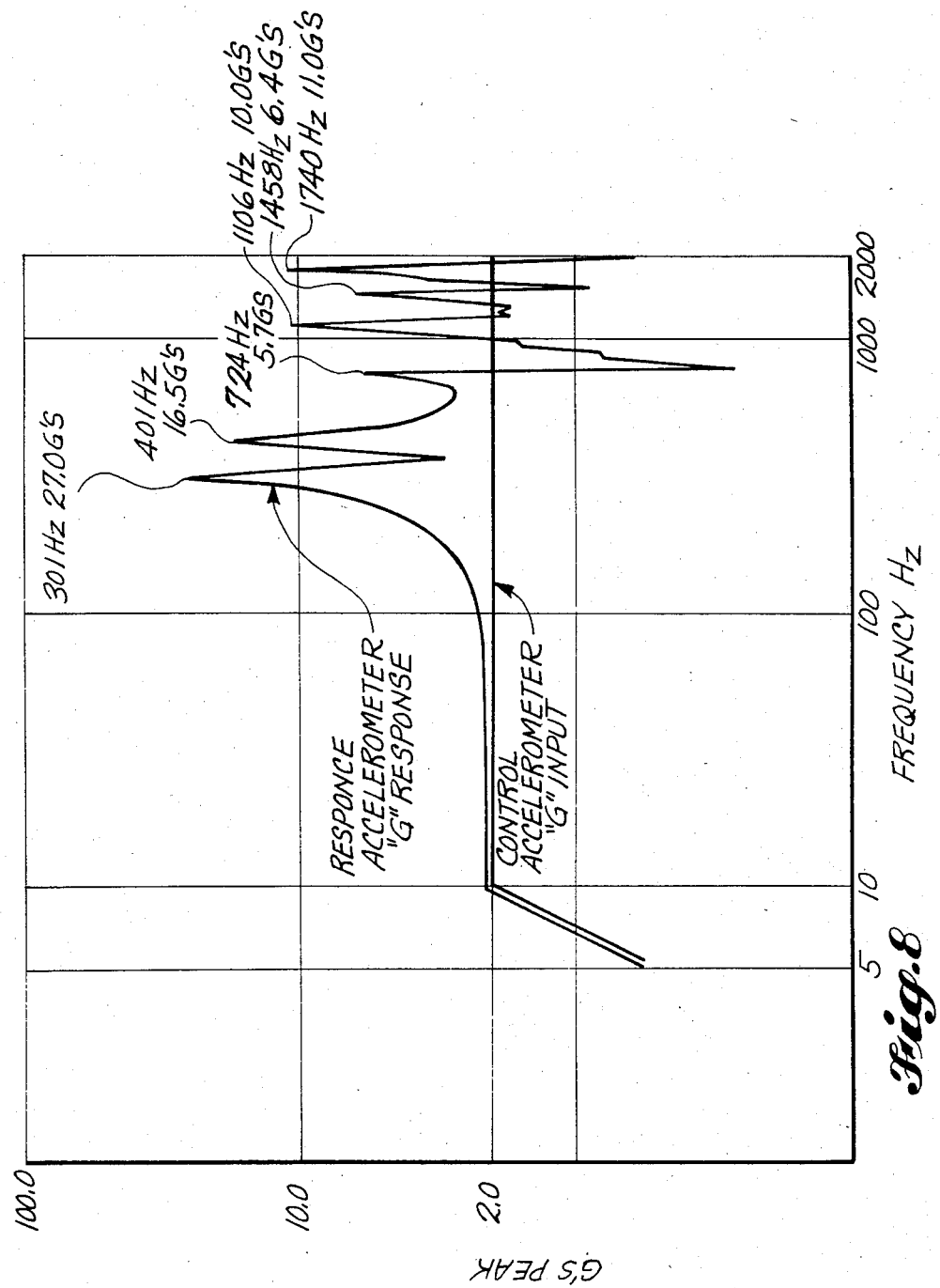
FIG. 8 is a graph like FIG. 7, but illustrating the dynamic vibrational response of a printed wiring assembly board to which there has been attached a vibration damping stiffening beam constructed according to the present invention.

FIGS. 7 and 8 are graphs plotting "g" input and response verses frequency of vibration. FIG. 7 illustrates the vibrational response of a printed wiring assembly board 12, such as the one shown in FIG. 1, without the use of a stiffening beam and energy absorbing material. FIG. 8 shows the vibrational response of the same board equipped with a stiffening beam and the energy absorbing material.

As shown by FIG. 7, the board alone has a peak fundamental response of approximately 88 g's at a frequency of 244 Hertz. The peak fundamental vibrational response of the same board equipped with a stiffening beam and energy absorbing material arranged as shown in FIGS. 2 and 3 experienced a peak fundamental vibrational response of approximately 27 g's at a frequency of 301 Hertz. Thus, the use of the stiffening beam 10, together with layers of the metallic foil tape arranged in shear, produced a substantial reduced displacement of the board and a substantial absorbtion of energy during the flexing of the beam and board, together resulting in a significant reduction in dynamic response of the assembly to vibrational forces.

The beam and absorbing material arrangement proved to be very beneficial. The beam takes up very little space on the circuit board. The amount of energy absorbing sheet material is small, because narrow strips of the material are used. The stiffening beam and the energy absorbing material together, oriented to function in shear, yielded significantly better results than was expected by the way that the energy absorbing material performed when applied flat against the surface of the board.

The particular viscoelastic material that is used on the aluminum foil tape Y434, manufactured by the 3M Company, is a viscoelastic polymer. These polymers are composed of long chain-like molecules tangled together in random formations. Vibrational forces cause these formations to slip and slide against each other. The metal foil is a constraining layer and its presence increases the strain on the molecules of the viscoelastic polymers. Through the friction of molecules, mechanical energy is converted into neglible heat which is dissipated within the damping layer.

The viscoelastic property of the polymers may be likened to an elastic band made of both rubber and putty. When you stretch a rubber band and then release it, it immediately retracts to its original length. When you pull putty, it absorbs energy and retains its extended shape. A viscoelastic material combines these two properties so it always returns to its original shape after being stressed, but does so slowly enough to oppose the next cycle of vibration.

The tapes and sheets of aluminum foil coated with viscoelastic polymers, of the type manufactured by the 3M Company, were made to be attached *flat* against the vibrating structure, in the manner disclosed by U.S. Pat. No. 2,819,032. As previously mentioned, it was found that when this material was placed on the side surfaces of the web portions of the stiffener beams 10, 10', placing the foil layers 32 and the viscoelastic material layers 34 in shear, due to the perpendicular relationship of the web to the vibrating structure, superior results were obtained with the use of only a relatively small amount of the material 30.

It is believed that the vibration absorbing viscoelastic materials disclosed by the aforementioned U.S. Pat. Nos. 2,819,032; 3,058,704; and 3,271,188, applied to a constraining layer of thin metal or other thin material which is inherently a relatively stiff material, would function well on the beam 10, 10', as the energy absorbing material 30.

It is to be understood that the examples which have been illustrated and described are merely illustrative of the invention and that the scope of the invention is not to be limited by the examples but only by the appended claims and the established rules of claim interpretation.

What is claimed is:

1. In combination:
    a member which in use is caused to vibrate and which has a structural makeup resulting in it wanting to vibrate at a relatively low frequency with a relatively large displacement;
    a stiffening beam secured to a surface of said member, to span across the member and stiffen the member and increase its frequency of vibration while at the same time decreasing the displacement of vibration, said beam having at least one side surface extending generally perpendicular to the surface of the member; and
    a plurality of layers of sheet damping material secured to each other and to said side surface of the stiffening beam by an adhesive material, said layers being attached to said side surface of said beam in a manner so that they are positioned generally perpendicular to the surface of the member, for damping vibration of the member by absorbing member vibrational energy which is transmitted to said stiffening beam from said member when it vibrates.

2. The invention according to claim 1, wherein said adhesive material is a viscoelastic material.

3. The invention according to claim 4, wherein each layer of sheet material is a metallic foil strip.

4. The invention according to claim 1, wherein said stiffening beam includes a mounting flange which is secured along its length to said member, and a web connected to said flange portion, said web extending generally perpendicular to said flange and having first and second side surfaces, said damping material being secured to at least one side surface of said web.

5. The invention according to claim 4, wherein said damping material is secured to both side surfaces.

6. The invention according to claim 5, wherein said stiffening beam is an "I" beam.

7. The invention according to claim 5, wherein said stiffening beam is an inverted "T" beam.

8. The invention according to claim 7, wherein said layers are continuous between said first and second side surfaces.

9. A damping stiffener beam, which in use is secured to a vibrating panel or the like, for damping vibration therein, comprising:
    an elongated rigid stiffening beam having a mounting base which in use is secured along its length to a surface of the vibrating panel, and stiffener means connected to said base, having at least one side surface which in use is oriented generally perpendicular to the surface of the panel; and
    a plurality of layers of sheet damping material secured to each other and to said side surface of said stiffener means by an adhesive material, said layers being attached to said stiffener means in a manner so that said layers are positioned generally perpendicular with respect to the surface of the vibrating panel, for damping vibration in the panel by absorbing panel vibrational energy which is transmitted to said stiffening beam from the panel when it vibrates.

10. The invention according to claim 9, wherein said adhesive material is a viscoelastic material.

11. The invention according to claim 10, wherein each layer is a metallic foil strip.

12. The invention according to claim 9, wherein said mounting base is a flange, and said stiffener means is a web which extends generally perpendicular to said flange and has first and second side surfaces, and wherein said damping material is secured to at least one side surface of said web.

13. The invention according to claim 12, wherein said layers are secured to said first and second side surfaces.

14. The invention according to claim 13, wherein said stiffening beam is an "I" beam.

15. The invention according to claim 13, wherein said stiffening beam is an inverted "T" beam.

16. The invention according to claim 15, wherein said layers are continuous between said first and second side surfaces.

* * * * *

UNITED STATES PATENT AND TRADEMARK OFFICE
CERTIFICATE OF CORRECTION

PATENT NO. : 4,566,231

DATED : January 28, 1986

INVENTOR(S) : Francis X. Konsevich

It is certified that error appears in the above-identified patent and that said Letters Patent are hereby corrected as shown below:

Claim 3, column 6, line 26, "4" should be -- 2 --.

Signed and Sealed this

Fifteenth Day of July 1986

[SEAL]

Attest:

Attesting Officer

DONALD J. QUIGG

Commissioner of Patents and Trademarks

UNITED STATES PATENT AND TRADEMARK OFFICE
CERTIFICATE OF CORRECTION

PATENT NO. : 4,566,231
DATED : January 28, 1986
INVENTOR(S) : Francis X. Konsevich It is certified that error appears in the above-identified patent and that said Letters Patent are hereby corrected as shown below:

In the description, after line 13, column 1, insert the following paragraph:

"The United States government has rights in this invention pursuant to Contract No. F33657-81-C-0213 awarded to The Boeing Company by the United States Air Force."

Signed and Sealed this

Twenty-sixth Day of August 1986

[SEAL]

*Attest:*

DONALD J. QUIGG

*Attesting Officer*  *Commissioner of Patents and Trademarks*